United States Patent [19]

Fisher

[11] Patent Number: 5,194,867
[45] Date of Patent: Mar. 16, 1993

[54] FLASH ANALOG-TO-DIGITAL CONVERTER EMPLOYING LEAST SIGNIFICANT BIT-REPRESENTATIVE COMPARATIVE REFERENCE VOLTAGE

[75] Inventor: Gregory J. Fisher, Indialantic, Fla.

[73] Assignee: Harris Corporation, Melbourne, Fla.

[21] Appl. No.: 816,321

[22] Filed: Dec. 30, 1991

Related U.S. Application Data

[63] Continuation of Ser. No. 696,241, May 6, 1991, abandoned.

[51] Int. Cl.$^5$ ............................................. H03M 1/36
[52] U.S. Cl. .................................... 341/159; 341/155
[58] Field of Search ............... 341/154, 155, 158, 159

[56] References Cited

U.S. PATENT DOCUMENTS

| | | | |
|---|---|---|---|
| 3,877,025 | 4/1975 | Maio | 341/159 |
| 4,600,916 | 7/1986 | Masuda et al. | 341/159 |
| 4,928,103 | 5/1990 | Lane | 341/159 |
| 4,965,579 | 10/1990 | Liu et al. | 341/159 |

Primary Examiner—Howard L. Williams
Attorney, Agent, or Firm—Evenson, Wands, Edwards, Lenahan & McKeown

[57] ABSTRACT

A flash analog-digital (A/D) coverter for producing an n-bit binary number whose value is related to an analog input voltage value includes a resistor ladder network having $2^{n-1}+1$ nodes. Each node is coupled to a comparator stage to provide an intermediate reference voltage to the stage. Each stage has a first output at which is provided a first output voltage whose value depends on whether the input voltage exceeds the intermediate reference voltage, and a second output voltage whose value depends on whether the input voltage exceeds the intermediate reference voltage by a least significant bit voltage. A combinational logic network is coupled to the first outputs of the stages for decoding the $n-1$ most significant bits of the n-bit number based on the highest intermediate reference voltage which does not exceed the input voltage. The network is further coupled to the second outputs of the stages to enable the second output of the stage corresponding to the highest intermediate voltage that does not exceed the input voltage through to be the least significant bit of the n-bit number.

22 Claims, 6 Drawing Sheets

FLASH ANALOG-TO-DIGITAL CONVERTER EMPLOYING LEAST SIGNIFICANT BIT-REPRESENTATIVE COMPARATIVE REFERENCE VOLTAGE

This is a continuation of application Ser. No. 696,241, of May 6, 1991, now abandoned.

FIELD OF THE INVENTION

This invention relates generally to the field of analog-to-digital (A/D) converters, and specifically relates to the field of parallel flash A/D converters which convert an analog voltage into a binary number in a short time, typically a single clock cycle.

BACKGROUND OF THE INVENTION

It has long been recognized that analog to digital conversion, i.e., the production of a binary number having a value related to an analog voltage input, presents a complex and challenging problem to circuit designers. Some A/D converters have been designed employing a successive approximation scheme. In such a device, a binary number generator is coupled to a digital-to-analog (D/A) converter (a relatively simple device). The output of the D/A converter is coupled to a first input of a comparator, and the input analog voltage is coupled to a second input of the comparator. The binary number is changed in value until a threshold value is determined at which the output of the D/A converter equals the input voltage, to within a suitable resolution. The binary number which the binary number generator is producing at that time is then deemed to be a digital equivalent of the input analog voltage.

A disadvantage of this type of device is that a series of binary approximations, which may consume a large number of system clock cycles, is required for finding the binary threshold value. Accordingly, this type of A/D converter is undesirably slow in operation.

To alleviate this problem of excessive time for producing a digital output, parallel flash A/D converter circuits have been employed. In a flash A/D circuit, a binary digital output can be produced in a single clock cycle. Conventional flash A/D converters have employed resistor ladder networks in which a series of resistors, each having the same value, is connected between high and low reference voltage sources. Nodes between the resistors provide reference voltages. Each node is connected to a stage, typically including a comparator, which produces an output signal whose value depends on whether or not the input voltage exceeds the corresponding reference voltage. Outputs of the stages are decoded to produce a binary number having a value related to the value of the analog input voltage.

It will be seen that, in general, a trade-off between circuit size and speed exists in A/D converters. The conventional successive approximation A/D converter is relatively small in size, but requires many clock cycles to provide a successive approximation digital equivalent of the analog input voltage. By contrast, the flash A/D converter described above produces an output in only one clock cycle, but requires a resistor ladder network having $2^n + 1$ resistors to produce $2^n$ nodes, $2^n$ stages, each of which may include a comparator, and a decoding network which, if implemented as a programmable logic array, has $2^n$ inputs and n outputs, and thereby requires a comparably large array of solid state devices for implementing the required interconnections. Thus there is a problem that an undesirably large circuit, or an undesirably large integrated circuit, has been required for producing a flash A/D converter.

SUMMARY OF THE INVENTION

Accordingly, an object of the present invention is to provide a flash A/D converter circuit which is advantageously small in size and component count compared with conventional flash A/D converter circuits.

An additional object of the invention is to provide a flash A/D converter circuit which may be implemented as an advantageously small, low-power integrated circuit.

To achieve these and other objects, there is provided in accordance with the invention a flash A/D converter circuit including a resistor ladder network having two resistors of value R/2, one resistor of value R, and $2^{n-1}-1$ resistors each having a value 2R which are coupled in series between first and second reference voltages to provide a ladder network, having $2^{n-1}+1$ reference voltages, $2^{n-1}-1$ first stages, each first stage being coupled to receive a reference voltage from a corresponding node of the ladder network, and to receive the input voltage, and first and second outputs. Each stage includes means for producing at the first output a voltage having the first value when the input voltage falls between the reference voltage from the ladder network and the next higher reference voltage and a second value otherwise, and means for producing at the second output a first voltage value when the input voltage exceeds the ladder network reference voltage by more than a least significant bit voltage and a second value otherwise. The converter also includes two second stages having a single output having a first value when the input falls between the reference voltage from the ladder network and the next higher reference voltage, and a second value otherwise. Finally, the converter circuit includes a combinational logic network connected to the first outputs of each stage and including means for producing an $n-1$ bit binary number having a value related to the highest ladder network reference voltage for which the input voltage exceeds the ladder network reference voltage, and means coupled to the second outputs of the stages for producing a least significant bit having a first value when the second output of the stage corresponding to the highest ladder network reference voltage which is lower in value than the input voltage has the first value, and having a second value otherwise. As a result, the $n-1$ bit binary number and the least significant bit together make up an n-bit binary number whose value is related to the value of the input analog voltage.

A circuit in accordance with the invention has several advantages over a conventional flash A/D converter. First, input current to the comparators is drawn from the ladder network, producing a linearity error in the ladder network reference voltages. A circuit in accordance with the invention has $2^{n-1}+1$ comparators connected to the resistor ladder, instead of $2^n$ as in conventional circuits, so the reference voltages at the ladder network have reduced linearity error. Secondly, a higher bandwidth for the resistor ladder is realized due to the reduced number of comparator connections. Also, since only $2^{n-1}+1$ comparators are employed to produce an n-bit binary number, less supply current is consumed and fewer devices are required. In addition, only $2^{n-1}+1$ connections are made to the input voltage. As a consequence, input impedance is increased and input capacitance is decreased. Finally, the overall circuit is considerably smaller in size and number of devices, because $2^{n-1}-1$ comparators are eliminated. If a programmable logic array (PLA) is employed as the combinational logic network, it is approximately half the size of a PLA employed in a conventional circuit.

DETAILED DESCRIPTION OF THE DRAWINGS

Figure 1:
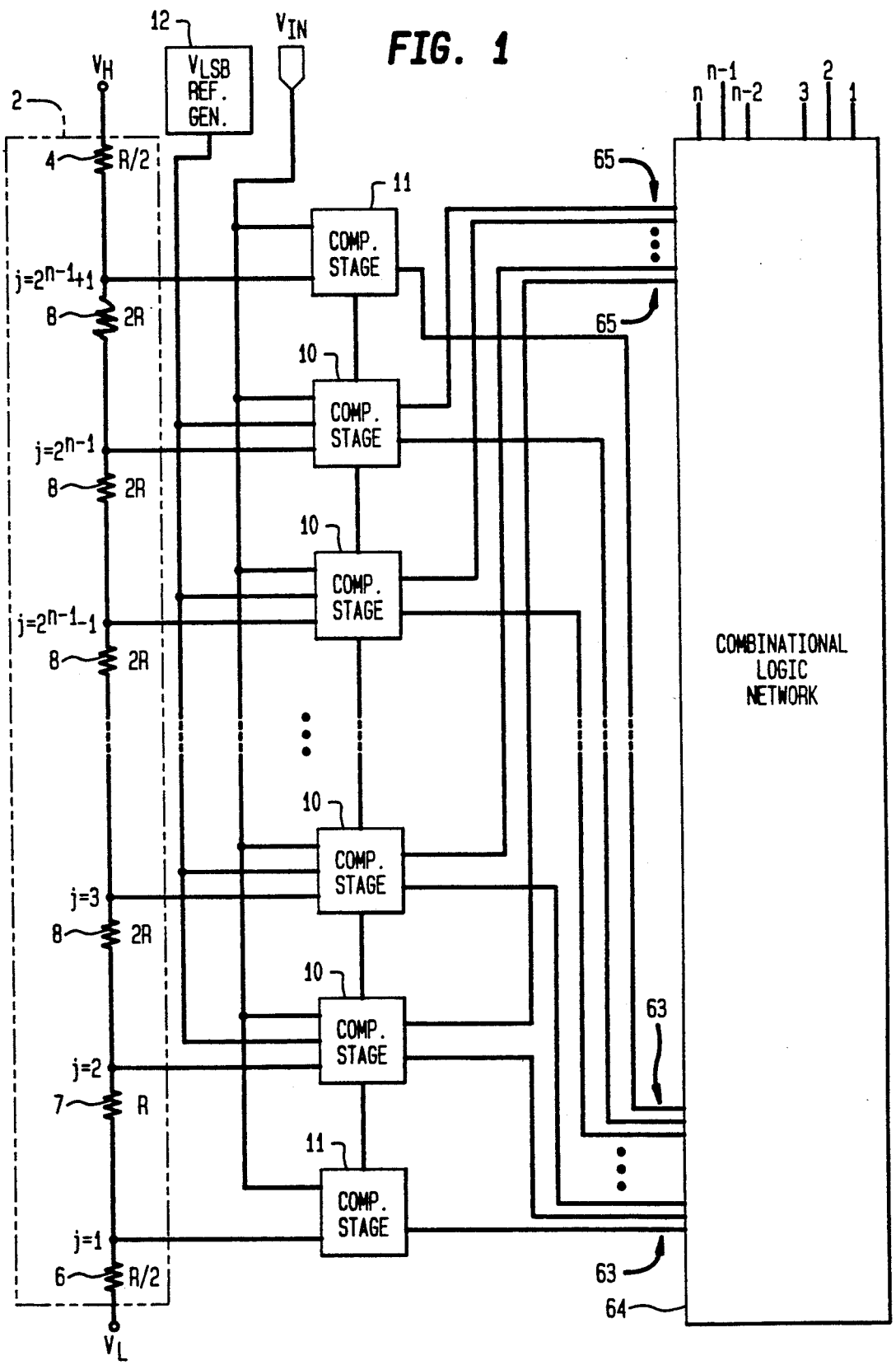
FIG. 1 is a schematic diagram of a flash A/D converter circuit according to the invention.

FIG. 1 shows a block diagram of a parallel flash A/D converter circuit according to the invention. The A/D converter is coupled to high and low reference voltages. The input analog voltage $V_{in}$ to be converted into a binary number lies somewhere in between the high and low reference voltages $V_H$ and $V_L$. If an n-bit binary number is to produced, then the resolution of the binary number may be given by the equation $$V_{LSB} = \frac{V_H - V_L}{2^n} \quad (1)$$

where $V_H$ is the high reference voltage and $V_L$ is the low reference voltage. The voltage $V_{LSB}$ given by this equation is a change in input voltage which corresponds to an incremental increase or decrease in the output binary number. The incremental increase or decrease may involve a change in state of the last significant bit of the binary number, i.e., a change from 11000000 to 11000001, for example. Thus, the voltage given by the above equation may be called a least significant bit voltage, and represented by $V_{LSB}$.

Referring to FIG. 1, a series resistor network 2 is shown connected between high and low voltage sources $V_H$ and $V_L$. The network includes first and second resistors 4, 6 each having a value R/2, where R is a predetermined value. First ends of the first and second resistors 4, 6 are respectively connected to the voltage sources $V_H$ and $V_L$. A third resistor 7 has a first end coupled to the second end of the second resistor 6. The third resistor 7 has the value R. The resistors 4, 7 also have second ends, to which are connected a series of resistors 8 having values 2R. While only a few of the resistors 8 are shown connected to each of the resistors 4 and 7, it will be understood that a series of $2^{n-1}-1$ of the resistors 8 are connected here, where n is the number of bits of the binary output number which is to be produced by the circuit. Between each pair of adjacent resistors in the ladder network 2 is a node. There are a total of $2^{n-1}+1$ nodes. The variable j, where $1 \leq j \leq 2^{n-1}+1$, will be used to denote the nodes.

When current flows through the resistor ladder network 2 from the $V_H$ voltage source to the $V_L$ voltage source, each node may be regarded as a node in a voltage divider. Accordingly, treating the ladder network as a voltage divider, an intermediate reference voltage $V_j$ at a jth node of the ladder network 2 may be calculated according to the following equations:

$$V_1 = \frac{1/2(V_H - V_L)}{2^n} + V_L \text{ for } j = 1 \quad (2)$$

$$V_2 = \frac{3/2(V_H - V_L)}{2^n} + V_L \text{ for } j = 2 \quad (3)$$

$$V_j = \frac{[2j - 5/2] \cdot (V_H - V_L)}{2^n} + V_L \text{ for } 3 \leq j \leq 2^{n-1} + 1 \quad (4)$$

In FIG. 1, each node is shown with a corresponding j value. For instance, the node between the resistor 6 and the resistor 7 is labeled j=1, the next node is labeled j=2, and so on. The node between the resistor 4 and the adjacent resistor 8 is labeled $j=2^{n-1}+1$, the next adjacent node is labeled $j=2^{2-1}$, and so on. Thus, the resistors 4, 6, and 7, and $2^{n-1}-1$ of the resistors 8 together make up a series ladder network having $2^{n-1}+1$ nodes.

FIG. 1 additionally shows, in block diagram form, a series of first comparator stages 10 and two second comparator stages 11. The second stages 11 are coupled to the first and $(2^{n-1}+1)$th nodes. There are $2^{n-1}-1$ stages 10, each one coupled to a respective node of the resistor ladder network 2. Each of the stages 11 is coupled to receive the input analog voltage $V_{in}$. Each of the stages 10 is coupled to receive the input analog voltage $V_{in}$ and a reference resolution voltage $V_{LSBREF}$ which is produced by a reference voltage generator 12.

Figure 2:
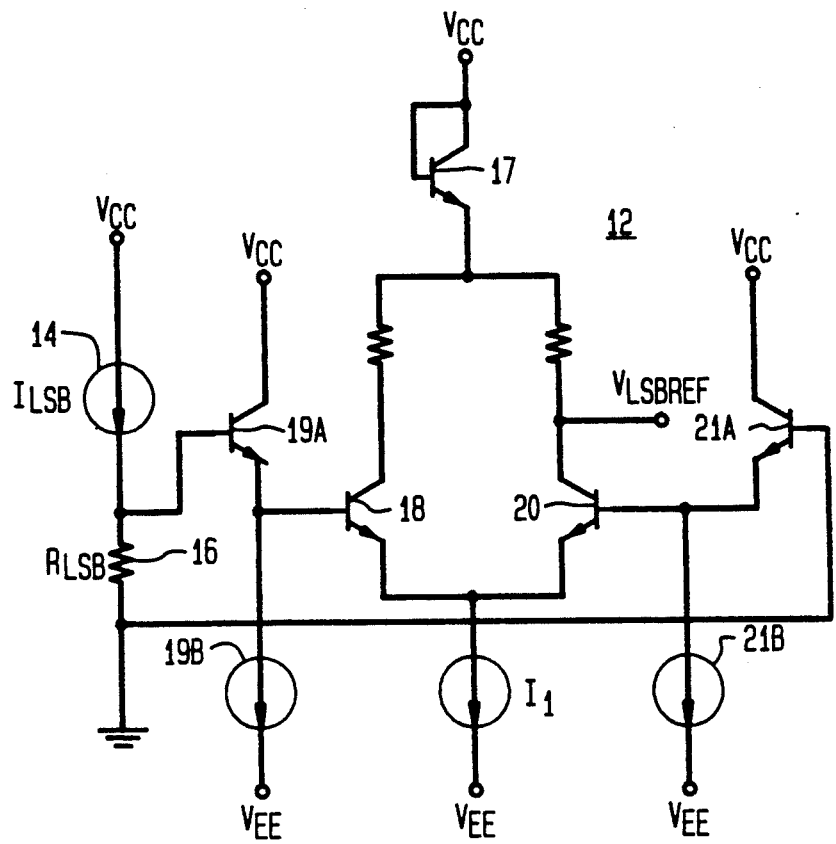
FIG. 2 is a detailed schematic diagram of a circuit for generating a reference voltage which is supplied to each of the stages of FIG. 1.

FIG. 2 shows a detailed circuit diagram of the reference voltage generator 12. The generator 12 produces a voltage $V_{LSBREF}$ whose value represents the gain of the comparator input stage times the limit of resolution of the A/D converter circuit, i.e., a voltage whose value corresponds to the change in voltage of the input signal $V_{in}$ which would cause the least significant digit of the output binary number to change value. A resolution voltage or least significant bit voltage $V_{LSB}$ may be expressed by equation (1), as shown above and repeated here:

$$V_{LSB} = \frac{V_H - V_L}{2^n} \quad (1)$$

This voltage value $V_{LSB}$ is generated across a resistor 16 shown in FIG. 2. A current source 14 and the resistor 16 respectively have values $I_{LSB}$ and $R_{LSB}$ such that $$I_{LSB} \times R_{LSB} = V_{LSB} \quad (5)$$

Transistors 18, 20 are interconnected in a differential amplifier configuration as shown. Their collectors are coupled through suitable resistors to an emitter of a transistor 17 configured to act as a diode, having a base and collector coupled to a power supply voltage $V_{CC}$. The emitters of the transistors 18, 20 are coupled together through a current source to a low power supply voltage $V_{EE}$. Emitter-follower circuits are coupled between the bases of the transistors 18, 20 and the ends of the resistor 16. A first end of the resistor 16 is coupled to a base of a transistor 19A, whose collector is coupled to a high power supply voltage and whose emitter is coupled through a current source 19B to a low power supply voltage. The base of the transistor 18 is coupled to the emitter of the transistor 19A. A similar emitter-follower circuit including a transistor 21A and a current source 21B is coupled between a second end of the resistor 16 and the base of the transistor 20. Accordingly, the voltage at the collector of the transistor 20 has a value $V_{LSBREF}$.

Returning now to FIG. 1, this voltage $V_{LSBREF}$ is supplied to each of the stages 10. While the circuit in FIG. 2 is deemed to be the best mode for implementing a reference voltage generator, it will be understood that other types of reference voltage generating circuits may be employed in place of the circuit of FIG. 2 for producing the required reference voltage. Any suitable reference voltage generating circuit is deemed to be within the spirit and scope of the invention.

Figure 3:
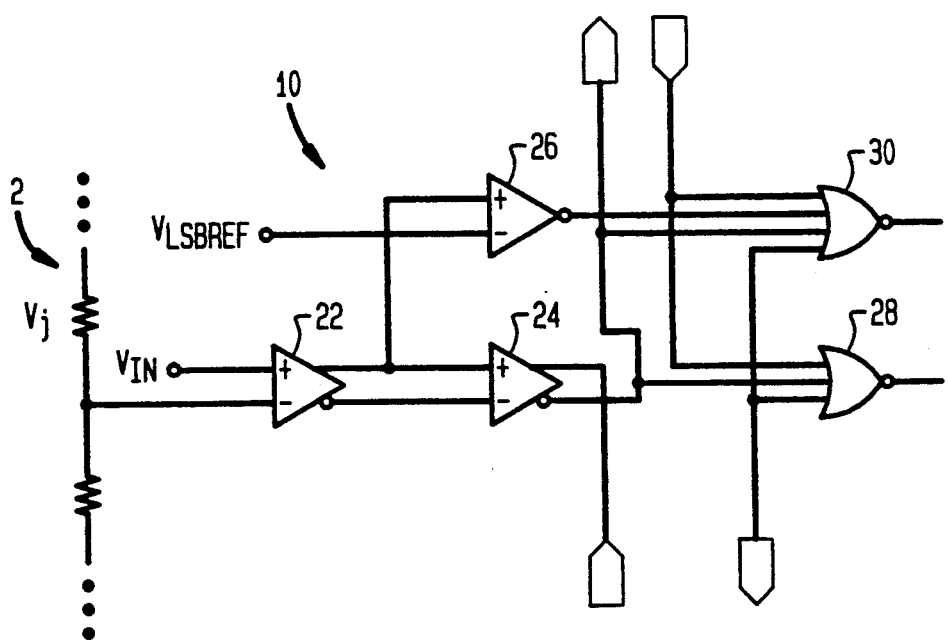
FIG. 3 is a schematic diagram of a first type of stage of the circuit of FIG. 1.

FIG. 3 shows a detailed schematic diagram of a first embodiment of one of the first stages 10. A portion of the resistor ladder network 2 is shown, in which the jth node having the voltage $V_j$ is between adjacent resistors 8. The node is coupled to a first input of a comparator 22. A second input of the comparator 22 is coupled to receive the input analog voltage $V_{in}$. The comparator 22 has an output which produces a signal whose value is determined by whether or not $V_{in}$ exceeds $V_j$. The particular comparator illustrated in FIG. 3 has both high true and low true outputs. However, other types of comparators which may have only one output, may be used in place of the comparator 22 shown. The outputs of the comparator 22 are coupled to inputs of a first latching amplifier 24. In the case of the amplifier shown in FIG. 3, non-inverting and inverting inputs are respectively coupled to the high true and low true outputs of the comparator 22. However, if a comparator having a single output is employed, then a suitable interface to the amplifier 24 may be employed, or a single-input amplifier may be used in place of the amplifier shown as 24. Responsive to input signals received from the comparator 22, the amplifier 24 has a high true output which produces an output signal having a first value when $V_{in}$ exceed $V_j$, and a second value otherwise, and an inverted output having a second value when $V_{in}$ exceeds $V_j$, and a first value otherwise.

There is additionally shown a second latching amplifier 26. The latching amplifier 26 has dual inputs. A first input is coupled to an output of the comparator 22. The second input is coupled to receive the reference voltage $V_{LSBREF}$. The latching amplifier 26 produces an output signal which has a first value if $V_{in}$ exceeds $V_j$ by a voltage greater than $V_{LSB}$, and a second value otherwise.

Figure 3A:
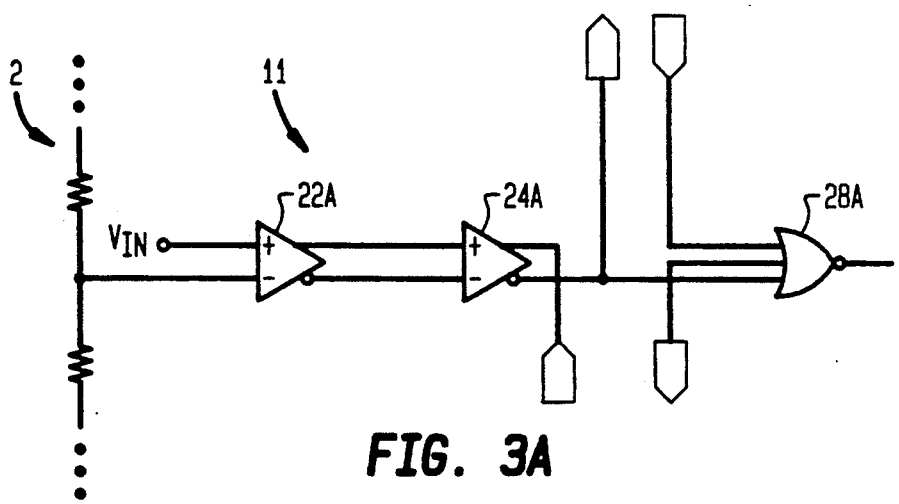
FIG. 3A is a schematic diagram of a second type of stage of the circuit of FIG. 1.

FIG. 3A shows a schematic diagram of a preferred embodiment of one of the second stage 11. A second stage 11 includes a comparator 22A, a differential amplifier 24A, and a logic gate 28A comparable to the devices 22, 24, and 28 in the first stage 10.

As stated above, the present embodiment employs two of the second stages 11, coupled to the first and $(2^{n-1}+1)$th nodes, and $2^{n-1}-1$ of the first stages 10 previously described. Alternatively, a conventional circuit not employing any of the first stages 10 would require $2^n$ comparator stages which might be essentially similar to stage 11, each typically including a comparator 22A and an amplifier 24A. Also, a resistor ladder network employing $2^n+1$ resistors to produce $2^n$ nodes is employed, each node being coupled to one of the comparator stages. It will be thus be seen that one comparator stage such as that shown in FIG. 3 takes the place of two of the conventional comparator stages. As a consequence, each comparator stage of FIG. 3 saves one comparator compared to a pair of comparator stages in a conventional circuit. $2^{n-1}-1$ comparators altogether are saved. Thus, a system employing a ladder network and stages as shown in FIGS. 1 and 3 represents a considerable savings in component count, circuit real estate, and power consumption compared with a conventional circuit.

The comparator stage 10 shown in FIG. 3 still provides outputs which are the equivalent of the two outputs of the two conventional comparator stages which it replaces. In a conventional circuit, $V_{LSB}$ is the voltage between adjacent nodes of the resistor ladder network. Thus, outputs of the first amplifier 24 of adjacent stages 10 may be thought of as corresponding to outputs of alternating conventional comparator stages, i.e., the second, fourth, sixth, etc., stages. Because the second amplifier 26 at each stage produces an output signal depending on whether $V_{in}$ exceeds $V_j$ by an amount greater than $V_{LSB}$, the output of the second amplifier 26 is equivalent to an output of an amplifier of an intervening conventional stage between two conventional stages corresponding to the first amplifiers 24 of adjacent stages as shown in FIG. 3, i.e., the third, fifth, etc., stages.

The stages may additionally include suitable combinational logic for producing output signals that allow for convenient configuration of the decoding logic for producing a binary number (described below). In the present embodiment, first and second logic gates 28, 30, here shown as NOR gates, may be provided. In the present embodiment, the first NOR gate 28 has three inputs. For the jth stage, the three inputs of the first NOR gate 28 are coupled respectively to the inverting outputs of the first amplifiers 24 of the (j−1)th and jth stages, and to the non-inverting output of the (j+1)th stage. Similarly, the second logic gate 30, also shown as a NOR gate, has four inputs. One of the inputs is coupled to the output of the second amplifier 26. The remaining three inputs are coupled respectively to the outputs of the first amplifiers 24 of the (j−1)th, jth, and (j+1)th stages. As a consequence, logic signals are provided at outputs of the gates 28, 30 which are related to the values of $V_j$ and $V_{in}$ as described above. In the present embodiment, the gates have low true logic outputs. However, depending on the overall implementation of the circuit, other suitable logic devices, which might have high true outputs, may be used instead.

Figure 4:
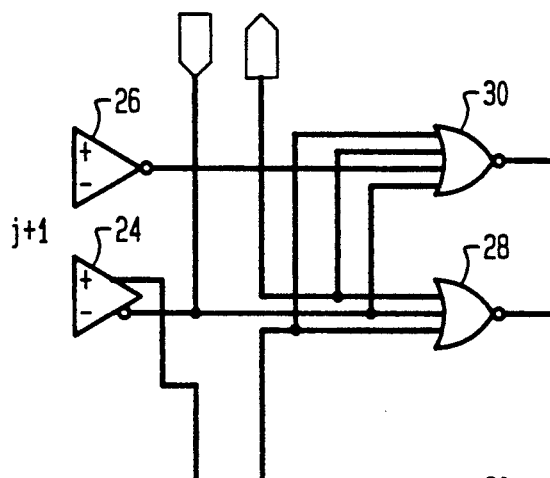
FIG. 4 is a schematic diagram of several adjacent stages as shown in FIG. 3, additionally showing interconnections between adjacent stages.
Figure 4:
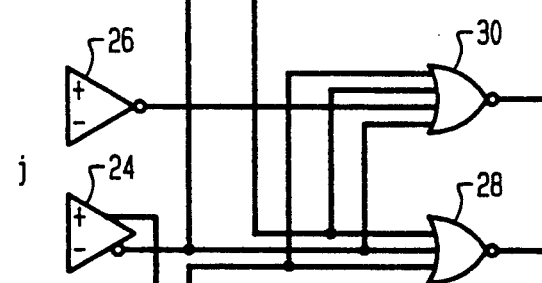
Figure 4:
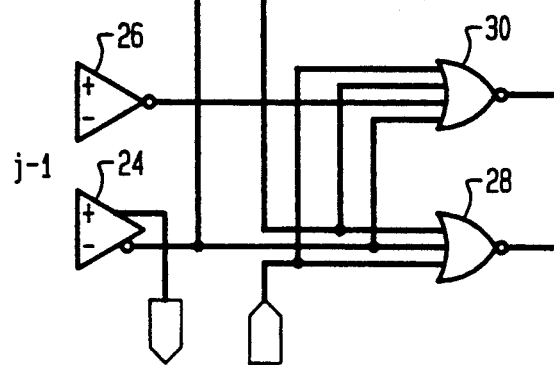

FIG. 4 shows a partial schematic diagram of three adjacent stages 10 as shown in FIG. 3. FIG. 4 is provided primarily to illustrate in more detail the interconnections between the outputs of the amplifiers 24, 26 and the inputs of the logic gates 28, 30 of the various stages. Specifically, the outputs of the amplifiers 24 and the inputs of the gates 28, 30 are coupled as described above.

Figure 5:
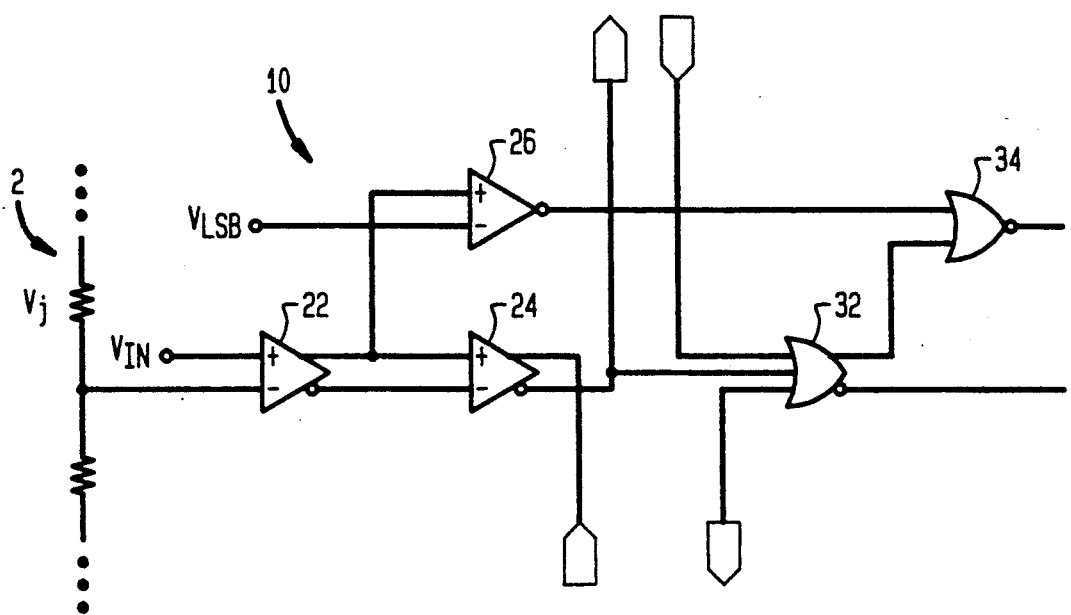
FIG. 5 is a schematic diagram of a second embodiment of a stage of the circuit of FIG. 1.

FIG. 5 shows a second embodiment of the stage 10 comparable to that of FIG. 3. The comparator 22 and the amplifiers 24, 26 are essentially similar to those of FIG. 3. However, the logic devices are implemented in a somewhat different manner. In place of the first logic gate 28, there is provided a first logic gate 32 which is implemented as an OR/NOR gate. This type of device is commonly employed in large scale integrated circuit design. Cell libraries employed for integrated circuit design commonly include logic devices which may have both high true and low true inputs or outputs. In this particular case, the logic gate 32 has both a high true and a low true output. The device 32 has three inputs which are connected in the same manner as the three inputs of the logic gate 28 of FIG. 3.

A second logic gate 34 is additionally provided. The logic gate 34 is shown as a NOR gate having two inputs. A first input is coupled to the output of the second latching amplifier 26, and the second input is coupled to the high true output of the logic gate 32. Logical analysis of the configuration of the gates 32, 34 will show that an output signal from the gate 34 has the same logical characteristics as the output of the logic gate 30 of FIG. 3. The alternative embodiment of FIG. 5 illustrates a somewhat simpler implementation of this logical function which may be employed in large scale integrated circuit design.

Again, when the overall implementation of the circuit is taken into account, other configurations of logic devices may be used in place of the devices 32, 34 to provide suitable logical functionality for decoding the outputs of the latching amplifiers to provide the binary number output from the circuit. Also, either high true or low true logic devices may be used as appropriate.

Figure 6:
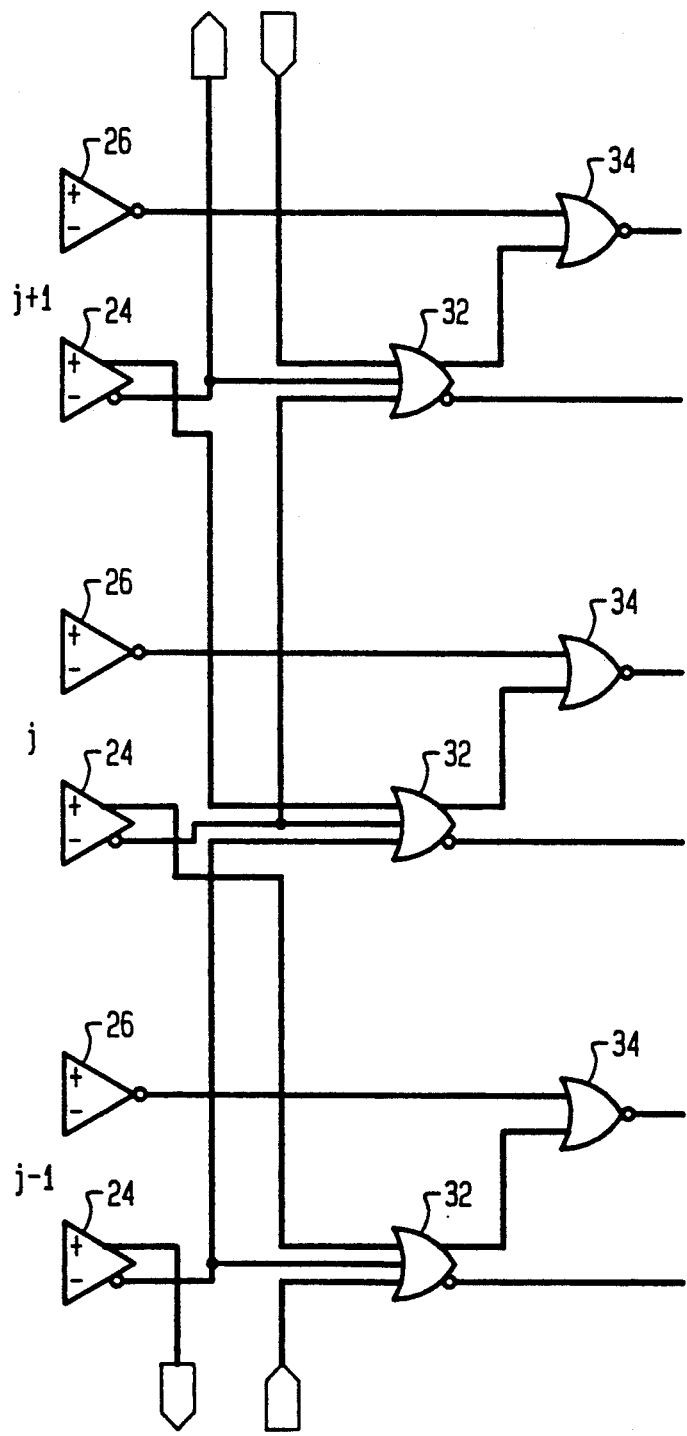
FIG. 6 is a schematic diagram of several adjacent ones of the stages of FIG. 5, showing interconnections in between adjacent stages.

FIG. 6 is essentially similar to FIG. 4, but shows three adjacent stages of the circuit where the embodiment of FIG. 5 is implemented. FIG. 6 also shows the interconnection between the adjacent stages. For instance, the logic gate 32 of the jth stage has three inputs which are respectively coupled to the outputs of the amplifiers 24 of the (j−1)th, jt, and (j+1)th stages.

Figure 7:
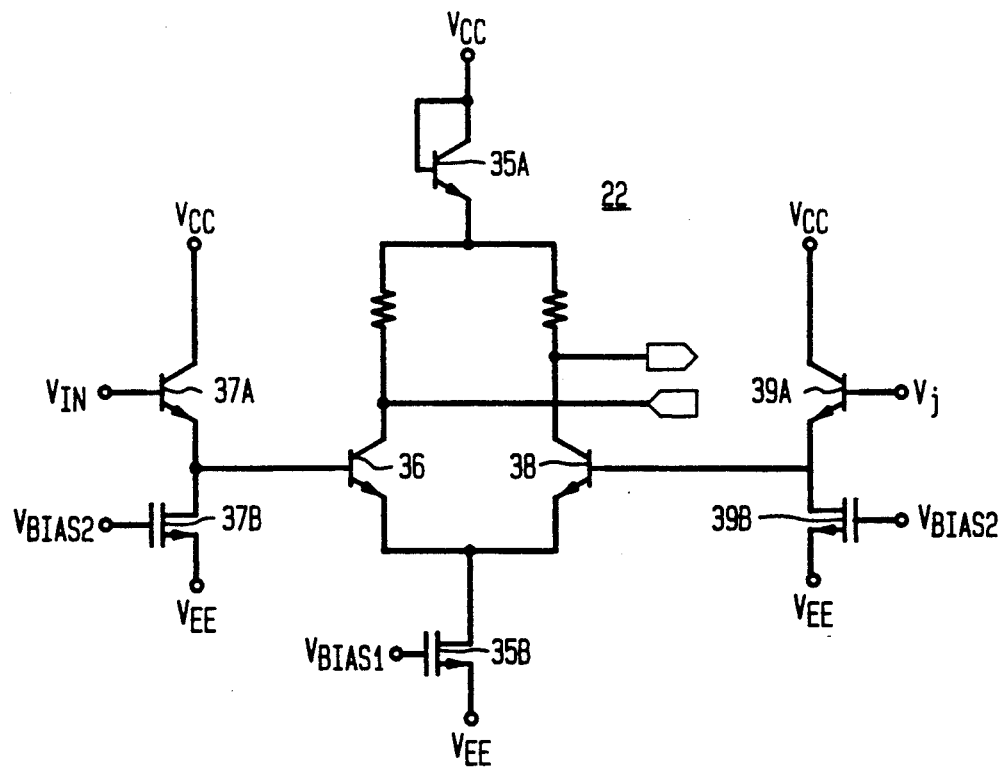
FIGS. 7, 8, and 9 are schematic diagrams showing more detailed implementations of various components of the stages of FIGS. 3 and 5.
Figure 8:
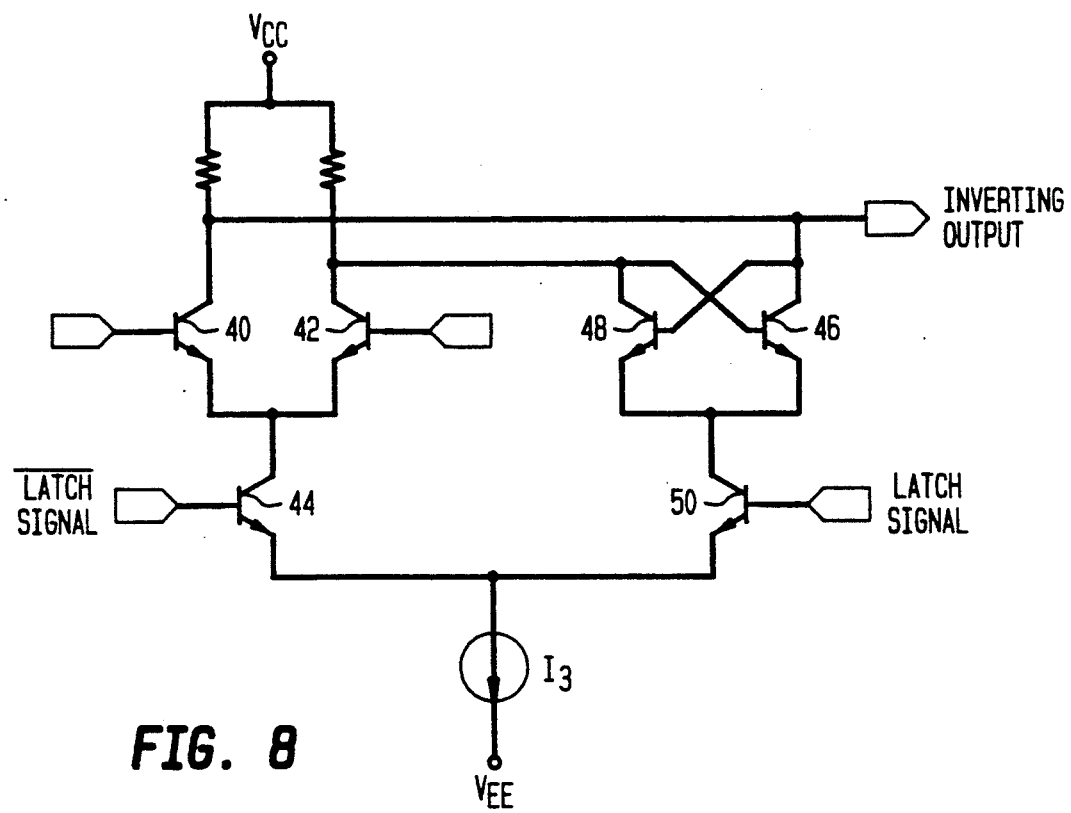
Figure 9:
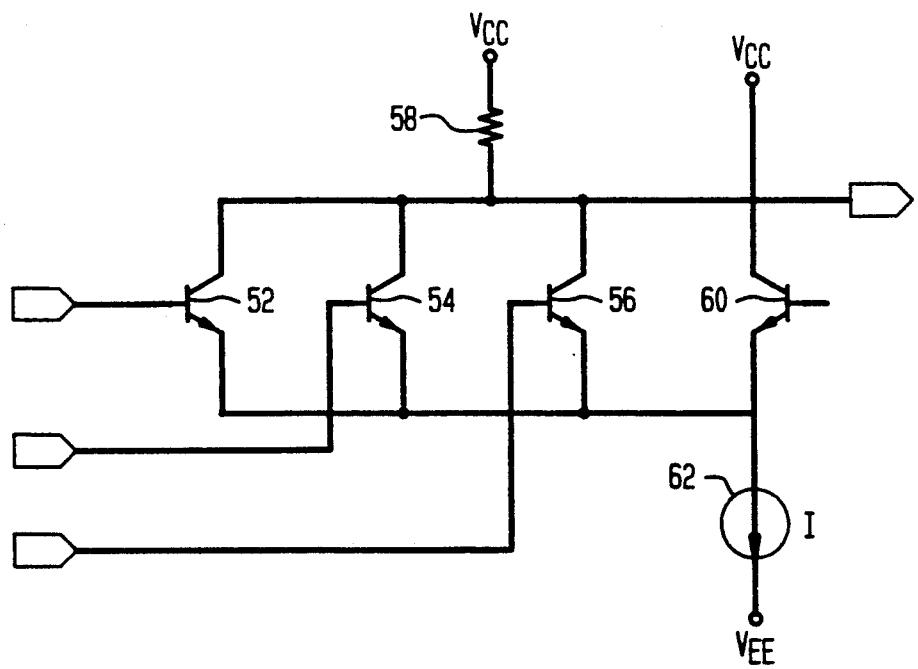

FIGS. 7–9 show detailed schematic diagrams of preferred embodiments of various devices which have been discussed heretofore. First, FIG. 7 shows a detailed implementation of the comparator 22 of FIGS. 2 and 4. Transistors 36, 38 have collectors which are respectively coupled through resistors to an emitter of a transistor 35A configured to act as a diode, having a base and collector coupled to a power supply voltage $V_{CC}$. Emitters of the transistors 36 and 38 are coupled to each other through a current source 35B to a low power supply voltage $V_{EE}$. In FIG. 7, the current source 35B is shown as a field effect transistor having a gate coupled to a suitable bias voltage, a drain coupled to other circuit elements (in this case the emitters of the transistors 36, 38), and a source coupled to a low power supply voltage $V_{EE}$. While other current sources elsewhere in the drawings are shown schematically, it will be understood that they could also be implemented with field effect transistors. Emitter-follower circuits also shown includes bipolar transistors 37A and 39A, and current sources 37B, 39B, also shown as field effect transistors. The input voltages $V_{in}$ and $V_j$ are respectively coupled to the bases of the transistors 37A and 39A. The emitters of the transistors 37A and 39A are respectively coupled to the bases of the transistors 36, 38. A dual output of the circuit is coupled to the collectors of the transistors 36, 38.

FIG. 8 shows a detailed schematic diagram of a latching amplifier circuit which may be employed as either the first amplifier 24 or the second amplifier 26 of FIGS. 3 and 5. A first pair of transistors 40, 42 is configured such that collectors of the transistors 40, 42 are coupled through resistors to a power supply voltage. Bases of the transistors 40, 42 are respectively coupled to receive high and low true input voltages. In a preferred implementation of the circuit as a whole, these inputs are coupled to the dual outputs of the circuit of FIG. 7 to implement the comparator 22 and the amplifier 24. Emitters of the transistors 40, 42 are coupled to each other and to a collector of a first latching transistor 44.

A second pair of transistors 46, 48 are coupled in a multi-vibrator configuration, i.e., the base of each transistor is coupled to the collector of the other transistor. Additionally, the base of the transistor 46 is coupled to the collector of the transistor 42, and the base of the transistor 48 is coupled to the collector of the transistor 40. The emitters of the transistors 46, 48 are coupled together to a collector of a second latching transistor 50. Low true and high true versions of a latching signal are respectively coupled to bases of the latching transistors 44, 50. The latching signal may be provided in a suitable manner. For instance, it may be derived from the system clock. Finally, emitters of the latching transistors 44, 50 are coupled together through a current source to a low power supply voltage. As before, the current sources could be implemented as field effect transistors.

While the circuit shown in FIG. 8 is described above as having the bases of the transistors 40, 42 coupled to high true and low true outputs of the comparator 22, it will be understood that this description is applicable to the amplifier 24 as shown in FIGS. 3 and 5. The amplifier 26 is substantially similar in configuration, except that the inputs to the transistors 40, 42 are coupled respectively to receive an output of the comparator 22 and the reference voltage $V_{LSBREF}$. In either case, an inverting output of the amplifier is coupled to the collector of the transistor 46.

Again, it will be understood that other implementations of a flash A/D converter according to the invention may employ different logical conventions. In such other cases, non-inverting outputs may be employed instead. Suitable modifications which would be known to one skilled in this art may be made on the basic teaching of FIG. 8 and the above-written description.

FIG. 9 shows a detailed circuit diagram implementing a three input NOR gate such as the gate 28 of FIG. 3. The three inputs are coupled to bases of transistors 52, 54, 56. Accordingly, if any of the inputs are high, base drive for the respective transistor will be provided, and current will be drawn from a power supply through a resistor 58 which is coupled to the collectors of each of the transistors. Thus an output of the circuit, which is shown as being coupled to the collectors of the transistors, will go low, thus providing an inverting output. Suitable additional circuitry, which may include a transistor 60 and a current source 62 coupled as shown, may be employed for drawing off the current flowing through the resistor 58 and the respective transistor or transistors. If all of the inputs are low, none of the transistors 52, 54, 56 will be conducting current. The current for the current source 62 will then be drawn through the transistor 60. It will be understood that suitable modifications to the basic logic circuit shown in FIG. 9 may be made to provide additional inputs, which may be high true or low true, and suitable high true and/or low true outputs to the circuits. Accordingly, this circuit may be modified to produce a logic circuit such as the logic gate 32 of FIG. 5.

Referring to FIG. 3, the comparator 22, the amplifier 24, and the logic gate 28 may together be regarded as means for producing a first output voltage which has a first value when $V_{in}$ exceeds $V_j$ and a second value otherwise. Also, the comparator 22, the amplifier 26, and the logic gate 30 may be regarded as means for producing a second output voltage having a first value when $V_{in}$ exceeds $V_j$ by at least $V_{LSB}$ and a second value otherwise. Similarly, in FIG. 5, the comparator 22, the amplifier 24, and the logic gate 32 may together be regarded as means for producing a first output voltage as described above. Finally, the shown components of the comparator stage circuit 10 of FIG. 5 in their entirety may be regarded as means for producing a second output voltage as described above.

Returning to FIG. 1, there is additionally shown a combinational logic network 64. The combinational logic network 64 includes $2^{n-1}-1$ first inputs which are respectively coupled to the first outputs of each of the stages 10 and 2 inputs coupled to the outputs of each of the stages 11 through lines collectively shown as 63, and an additional $2^{n-1}-1$ second inputs connected to the second outputs of the stages 10 through lines collectively shown as 65. The network 64 has n outputs, which are numbered 1 through n as shown in FIG. 1. Essentially, the combinational logic network 64 produces an n-bit binary number at the n outputs based on the signals it receives over the $2^{n-1}-1$ first outputs and the $2^{n-1}-1$ second outputs of the stages 10.

The n-bit binary number is produced according to the following basic principles: the bits 2 through n of the output are decoded from the information provided from the first outputs of the stages 10. For some threshold value of j, which will be denoted as j=max, $V_{max}$ will be the highest intermediate reference voltage which does not exceed the input voltage $V_{in}$. That is, $V_{in} > V_j$ for $1 \leq j \leq$ max, and $V_{in} < V_j$ for max$+1 \leq j \leq 2^{n-1}+1$.

The higher value of $V_{in}$, i.e., the closer $V_{in}$ is to $V_H$, the closer max will be to $2^{n-1}$.

The outputs of amplifier 24 of the first through max-th stages are in a first logic state indicating that the voltage $V_{in}$ exceeds the reference voltages at the 1st through max-th nodes. For each of the remaining stages max+1 through $2^{n-1}$, the reference voltage exceeds $V_{in}$, and the outputs of amplifier 24 are in a second logic state. The NOR gates 28 of each stage 10 and stage 11 will decode the series of amplifier 24 outputs such that the first output of the j=max stage will be in a first logic stage while all other first outputs will be at a second logic state. Accordingly, the binary output bits 2 through n are decoded from the number max, the highest value of j for which $V_{in}$ exceeds $V_j$.

The least significant bit, i.e., the one bit shown in FIG. 1, is produced from the value of the second output of the stage 10 corresponding to the binary number produced at the outputs 2 through n, i.e., the second output of the max-th stage. Thus it may be said that the second output of the max-th stage is enabled to the least significant output of the logic network 64 by virtue of the fact that the max-th stage (i.e., where j=max) is the highest for which $V_{in}$ exceeds $V_j$. As a consequence, the least significant bit of the output binary number is in a first logic state when $V_{in}$ exceeds $V_{max}$ by at least $V_{LSB}$ and in a second logic state otherwise.

In accordance with these basic principles, the combinational logic network 64 may conveniently be implemented as a programmable logic array (PLA). Here it may be noted that another advantage of a circuit in accordance with the invention over a conventional circuit may be observed. In a conventional circuit employing a programmable logic array, the PLA essentially is a decoder converting $2^n$ inputs into n outputs. As a consequence, a grand total of $n \times 2^{n-1}$ devices or logic interconnections must be implemented inside the PLA. Accordingly, the device takes up a considerable amount of circuit real estate and consumes a considerable amount of power. By contrast, a circuit in accordance with the principle described above implements $2^{n-2} \times (N-1)$ devices or circuit interconnections to decode the first outputs of the stages 10 into the $(n-1)$ most significant bits of the output binary number.

To enable the least significant bit of the output binary number, one device or circuit interconnection inside the PLA is required for each stage. This is because the value of the signal at the second output of the stage 10 must be enabled from one of the stages through to the binary least significant bit output, depending on whether the first output of that stage has been decoded as the $(n-1)$ most significant bits of the binary number.

Taking into account all of the devices or circuit interconnectors required for the above-described functions, the PLA is reduced in size by a factor of $(n-1)/2n$, i.e., approximately 50 percent compared with a conventional circuit. It will thus be seen that a circuit according to the invention advantageously reduces circuit real estate and power consumption, and provides other advantages over conventional flash A/D converter circuits.

While we have shown and described an embodiment in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed is:

1. A resistor network for a circuit which produces an n-bit binary output code, the value of which is representative of an input voltage applied to an input terminal in accordance with a comparison of the input voltage with intermediate reference voltages between high and low reference voltages, said resistor network having a plurality of nodes from which respective ones of said intermediate voltages that fall between said high and low reference voltages are obtained, said intermediate reference voltages differing from one another by multiples of two least significant bit voltages, and wherein said resistor network is configured such that the voltage difference between intermediate reference voltages provided at a prescribed two of said nodes is equal to a least significant bit voltage.

2. A resistor network according to claim 1, said resistor network including:
   first and second resistors, each having first and second ends, the first ends being coupled to the high and low reference voltages, respectively, the first and second resistors each having a value 1/2R, where R is a predetermined value, a third resistor having a first end coupled to the second end of the second resistor and having a second end, the third resistor having a value R, and a plurality of resistor stages, for providing the plurality of intermediate reference voltages, coupled in series between the second ends of the first and third resistors, each stage contributing a voltage drop corresponding to two least significant bit voltages.

3. A resistor network according to claim 1, further including:

means for comparing the intermediate reference voltages with the input voltage to produce, for each intermediate reference voltage;

a first output whose value depends on whether the input voltage exceeds one of the intermediate reference voltages; and a second output whose value depends on whether the input voltage exceeds the one intermediate reference voltage by more than the least significant bit voltage.

4. A resistor network according to claim 1, further comprising:

comparator means for determining a highest one of the intermediate reference voltages which does not exceed the input voltage;

first logic means for generating fewer than n bits of an n-bit code based on the determined intermediate reference voltage; and means for generating one bit of less significance than said fewer than n bits of the n-bit code based on whether the input voltage exceeds the determined intermediate reference voltage by more than the least significant bit voltage.

5. A method for producing an n-bit binary number having a value representative of an input voltage ranging between a high reference voltage and a low reference voltage, said method comprising the steps of:

(a) generating a plurality of additional reference voltages ranging in value between said high and low reference voltages;

(b) generating a voltage representative of the least significant big in said n-bit binary number;

(c) providing an output signal representative of which pair of immediately adjacent ones of said plurality of additional reference voltages said input voltage falls between; and (d) determining whether said input voltage differs from a prescribed one of said pair of immediately adjacent additional reference voltages by said voltage representative of the least significant bit in said n-bit binary number.

6. A method for producing an n-bit number according to claim 5, wherein the step (c) of providing an output signal includes:

for each of the plurality of additional reference voltages producing a first signal having a first value if the input voltage exceeds the additional reference voltage and a second value otherwise; and determining the highest of the plurality of additional reference voltages for which a first signal having the first value is produced.

7. A method for producing an n-bit binary number according to claim 5, wherein the step (d) of determining includes:

producing a second signal having a first value if the input voltage exceeds said prescribed one additional reference voltage by more than a least significant bit voltage and a second value otherwise.

8. A method for producing an n-bit binary number according to claim 7, further comprising the steps of:

(e) setting the least significant bit of the binary number to the value 1 if the second signal has the first value and;

(f) setting the least significant bit of the binary number to the value 0 if the second signal has the second value.

9. The method of claim 5 wherein the step (d) of determining whether the input voltage and the prescribed additional reference voltage differ by more than the least significant bit voltage is performed by comparing the least significant bit representative voltage with the difference between the input voltage and the prescribed additional reference voltage.

10. The method of claim 9, wherein the step of comparing is performed by: scaling said difference between the input voltage and the prescribed additional reference voltage with a difference amplifier according to the ratio of the voltage generated in step (b) to the least significant bit voltage; and comparing the the scaled difference with the voltage generated in step (b).

11. The method of claim 10 further including the step (f) of setting a bit other than the least significant bit according to the output signal provided in step (c).

12. The method of claim 5 further including the step (e) of:

setting the least significant bit of the n-bit number based on whether the input voltage exceeds said prescribed additional reference voltage by more than the least significant bit voltage.

13. The method of step 12 where n-1 bits are set according to the output signal provided in step (c).

14. The method of claim 5, wherein the output signal provided in step (c) is representative of a highest one among all of the additional reference voltages which does not exceed the input voltage.

15. A method for according to claim 5, wherein step (d) comprises determining whether said input voltage differs from the lower one of said pair of immediately adjacent additional reference voltages by said voltage representative of the least significant bit in said n-bit binary number.

16. A circuit for measuring the voltage of an input signal ranging between high and low reference voltages to within a resolution voltage range V, comprising:

a resistor network coupled between high and low reference voltage inputs to provide additional reference voltages between the high and low reference voltages; and a plurality of two-stage comparators coupled to receive said input voltage and respective additional reference voltages provided by said resistor network, a respective two stage comparator circuit having:

first stage inputs coupled to receive the input signal and one of the reference voltages;

a first stage output providing a signal of predetermined gain indicating whether the input signal voltage exceeds said one reference voltage;

a second stage input for receiving a signal indicative of V; and a second stage output providing a signal indicating whether the input signal voltage exceeds said one reference voltage by more than V.

17. The circuit of claim 16, wherein the resistor network is configured to provide a plurality of the reference additional voltages with magnitudes differing from one another in multiples of a second resolution voltage greater than V.

18. The circuit of claim 17, wherein the second resolution voltage is 2V and the magnitudes of the plurality of additional reference voltages differ from one another by integral multiples of 2V.

19. The circuit of claim 16, wherein the second stage comparator input is indicative of V in proportion to the first output signal gain, said comparator circuit including an additional stage having a third stage input for receiving the first output signal and providing a third output signal greater than the first output signal also indicating whether the input signal voltage exceeds said one reference voltage.

20. The circuit of claim 16, configured as an analog-to-digital converter providing a binary output signal indicative of an analog input signal voltage, the circuit further comprising:
- a plurality of additional two-stage comparator circuits each having first stage inputs coupled to receive the input signal and a selected additional reference voltage, a first stage output indicating whether the input signal voltage exceeds the selected additional reference voltage, a second stage output signal indicating whether the input signal voltage exceeds the selected additional reference voltage by more than V;
- logic circuitry for identifying one among the plurality of additional reference voltages to generate a first part of the binary output signal;
- decoder circuitry coupled with the logic circuitry to generate the first part of the binary output signal and coupled to generate a second part of the binary output signal based on the second stage output signals.

21. The circuit of claim 20, wherein the first part of the binary output signal comprises bits of more significance than present in the second part of the binary output signal.

22. The circuit of claim 20, wherein the second part of the binary output signal provides resolution of the input signal voltage within the range V.

* * * * *